United States Patent
Dahlqvist Leinhard et al.

(10) Patent No.: US 8,605,967 B2
(45) Date of Patent: Dec. 10, 2013

(54) MAGNETIC RESONANCE IMAGING RELATING TO CORRECTION OF CHEMICAL SHIFT ARTIFACT AND INTENSITY INHOMOGENEITY

(75) Inventors: Olof Dahlqvist Leinhard, Linköping (SE); Magnus Borga, Linköping (SE); Peter Lundberg, Linköping (SE)

(73) Assignee: Advanced MR Analytics AB, Linkoping (SE)

( * ) Notice: Subject to any disclaimer, the term of this patent is extended or adjusted under 35 U.S.C. 154(b) by 489 days.

(21) Appl. No.: 12/988,066

(22) PCT Filed: Apr. 17, 2009

(86) PCT No.: PCT/SE2009/000195
§ 371 (c)(1),
(2), (4) Date: Dec. 27, 2010

(87) PCT Pub. No.: WO2009/128764
PCT Pub. Date: Oct. 22, 2009

(65) Prior Publication Data
US 2011/0091090 A1     Apr. 21, 2011

Related U.S. Application Data

(60) Provisional application No. 61/045,888, filed on Apr. 17, 2008.

(51) Int. Cl.
*G06K 9/00*     (2006.01)
(52) U.S. Cl.
USPC ........................................................ 382/128
(58) Field of Classification Search
None
See application file for complete search history.

(56) References Cited

U.S. PATENT DOCUMENTS

| | | | |
|---|---|---|---|
| 5,886,524 A | 3/1999 | Krieg | |
| 6,466,014 B1 | 10/2002 | Ma | |
| 6,750,650 B2 | 6/2004 | Kiefer et al. | |
| 7,375,522 B2 * | 5/2008 | Reeder | 324/307 |
| 7,432,707 B1 | 10/2008 | Boitano | |
| 2004/0032977 A1 | 2/2004 | Blezek et al. | |
| 2004/0056660 A1 | 3/2004 | Yatsui et al. | |

(Continued)

FOREIGN PATENT DOCUMENTS

| | | |
|---|---|---|
| EP | 0 851 236 A1 | 7/1998 |
| EP | 0851236 A1 | 7/1998 |

OTHER PUBLICATIONS

Jingfei MA; "Breath-Hold Water and Fat Imaging Using a Dual-Echo Two-Point Dixon Technique With an Efficient and Robust Phase-Correction Algorithm", Magnetic Resonance in Medicine 52:415-418 (2004), pp. 415-419.

(Continued)

*Primary Examiner* — Claire X Wang
(74) *Attorney, Agent, or Firm* — Ladas & Parry LLP

(57) ABSTRACT

Present invention discloses systems and methods for improvement of magnetic resonance images. Correction of a chemical shift artefact in an image acquired from a magnetic resonance imaging system is obtained by a system and a method involving iterative-compensation for the misregistration effect in an image domain. Correction of an intensity inhomogeneity in such images is obtained by a system and a method involving locating voxels corresponding to pure adipose tissue and estimating correction field from these points.

32 Claims, 5 Drawing Sheets

(56) References Cited

U.S. PATENT DOCUMENTS

| 2005/0085713 | A1 | 4/2005 | Reeder et al. |
| 2006/0182363 | A1 | 8/2006 | Jellus |
| 2006/0250131 | A1 | 11/2006 | Reeder et al. |
| 2007/0285094 | A1 | 12/2007 | Reeder et al. |
| 2008/0012565 | A1 | 1/2008 | McKenzie et al. |
| 2008/0048657 | A1 | 2/2008 | Reeder |

OTHER PUBLICATIONS

J. Rydell, et al; "Three dimensional phase sensitive reconstruction for water/fat separation in MR imaging using inverse gradient" In Proceedings of the International Society for Magnetic Resonance in Medicine annual meeting (ISMRM'08), vol. 16. Toronto, Canada: ISMRM, 2008; 1521 1 page.

Hans Knutsson, et al; "Morphons: Segmentation Using Elastic Canvas and Paint on Priors", Reprint from IEEE International Conference on Image Processing (ICIP 2005), Genova, Italy, Sep. 2005, pp. 1-4.

S. Moon-Ho Song, et al; "Phase Unwrapping of MR Phase Images Using Poisson Equation", IEEE Transactions on Image Processing, vol. 4, No. 5, May 1995, pp. 667-676.

Joakim Rydell, et al; "Phase Sensitive Reconstruction for Water/Fat Separation in MR Imaging Using Inverse Gradient", In International Conference on Medical Image Computing and Computer-Assisted Intervention (MICCAI'07). Brisbane, Australia, 2007, pp. 1-8.

Hans Knutsson; "Normalized and Differential Convolution Methods for Interpolation and Filtering of Incomplete and Uncertain Data", CVPR'93, New York City, USA, Jun. 1993, pp. 515-523.

J Rydell, et al; "Three dimensional phase sensitive reconstruction for water/fat separation in MR imaging using inverse gradient", (No Date Found or Given) https://www.imt.liu.se/mi_old/Publications/pdfs/rjlkflb08.pdf.

Joakim Rydell, et al; "Phase Sensitive Reconstruction for Water/Fat Separation in MR Imaging Using Inverse Gradient", MICCAI 2007, Part 1, LNCS 4791, pp. 210-218, 2007 (Exact Date Not Given).

Charles H. Cunningham, et al; "Design of Flyback Echo-Planar Readout Gradients for Magnetic Resonance Spectroscopic Imaging", Magnetic Resonance in Medicine 54:1286-1289 (Nov. 2005).

International Preliminary Report on Patentability for Appln. No. PCT/SE2009/000195.

Zujun Hou; "A Review on MR Image Intensity Inhomogeneity Correction", Hindawi Publishing Corporation International Journal of Biomedical Imaging, vol. 2006, Article ID 49515, pp. 1-11; Aug. 7, 2006.

O. Dahlqvist Leinhard, et al; "Quantitative abdominal fat estimation using MRI", Proceedings of the $19^{th}$ International Conference on Pattern Recognition (ICPR), Tampa, FL, Dec. 2008, USA whole document.

Lane F. Donnelly, et al; "Using a Phantom to Compare MR Techniques for Determining the Ratio of Intraabdominal to Subcutaneous Adipose Tissue", AJR. American Journal of Roentgenology, Apr. 2003, USA, vol. 180, No. 4, pp. 993-998.

International Search Report: PCT/SE2009/000195.

\* cited by examiner

MAGNETIC RESONANCE IMAGING RELATING TO CORRECTION OF CHEMICAL SHIFT ARTIFACT AND INTENSITY INHOMOGENEITY

TECHNICAL FIELD

The present disclosure relates to improving images acquired from magnetic resonance imaging systems. More specifically it relates to correction of a chemical shift artifact and to correction of an intensity inhomogeneity in such images.

BACKGROUND

Phase sensitive acquisition and reconstruction, such as an "in-phase sand out-of-phase"-method of which the Dixon method may be best known, see e.g. W. T. Dixon, "Simple proton spectroscopic imaging," *Radiology*, vol. 153(1), pp. 189-194, 1984, has many advantages. Dixon imaging provides two images, one showing the fat content in each voxel and one showing the water content in each voxel. Hence Dixon images are not adversely affected by partial volume effects. Separate water and fat images are also useful in the segmentation process. In short, Dixon imaging is performed by acquiring two separate images: one where the signals from fat F and water W are out of phase (OP=W−F) and one where they are in phase (IP=W+F). Ideally, water and fat thus can be obtained from the sum and difference of these images, respectively, and the total fat content in any region of interest can be calculated as the integral of the fat image over that region.

A chemical shift artifact manifested as a water fat shift artifact causes distortion in water and fat images obtained using phase sensitive acquisition and reconstruction, as in the Dixon method. The resonance frequency of protons in human methylene lipid [CH2]n and water differ by 3.5 ppm corresponding to 224 Hz at a field strength of 1.5 T. This intrinsic difference can be utilized for effective fat and water separation using the phase sensitive acquisition and reconstruction. However, a consequence from utilizing resonance frequency shift in such methods is spatial misregistration in the frequency encoding direction known as the chemical shift artifact, in the case of fat and water images, the water-fat shift artifact. In magnetic resonance imaging (MRI) the frequency is used to encode the spatial position of the signal. As the RF-pulse is tuned at the frequency of water, fat will have a relative frequency shift that cannot be distinguished from the phase difference introduced by the frequency encoding. The water-fat shift artifact typically appears close to fat structures and is caused by the bi polar gradient being used.

A flyback protocol has been proposed, see e.g. Cunningham. *Magnetic Resonance in Medicine*, 2005. p. 1286-1289, to eliminate the problem as the misregistration is constant between acquisition times, but has the effect of decreasing the signal to noise ratio (SNR).

The effect of the water fat shift artifact is typically not negligible in phase sensitive reconstruction such as Dixon imaging. Artifacts originating from the water fat shift should thus be handled in order to take full advantage of the highly effective fat and water suppression and high SNR that is enabled by the technique. A specific example of a situation where the artifact become important is during the examination of thin structures or organ surfaces surrounded by fat where the clinical question often is to judge if pathologic tissue penetrates the structure or not.

Intensity inhomogeneity prevalence in MRI is due to factors such as static field inhomogeneity, RF excitation field non-uniformity, in homogeneity in reception coil sensitivity and patient movement. The effect of the non-uniformity is usually a slow varying non anatomic intensity variation over the image. Although it sometimes can be difficult to see the intensity non-uniformity by visual inspection there are implications that significantly can decrease segmentation and registration results as many medical imaging techniques is based on the assumptions that the same tissue has the same intensity throughout a volume. More importantly it affects the linear quantification of the MR signal. A voxel containing a certain amount of fat should have the same signal strength, independent of where it is located in space. This is not true in case of intensity inhomogeneity occurrence.

SUMMARY OF INVENTION

In view of the above, a general object of this disclosure is to present a solution overcoming or at least alleviating problems in the prior art.

One more specific object is to present a solution that enables correction of, or at least alleviation of effects from, chemical shift artifact in an image acquired from a magnetic resonance imaging system.

It has been found that iteratively compensating for the misregistration effect, i.e. the chemical shift artifact, can be an effective approach. An iterative method has been developed addressed to this approach.

Another more specific object is to present a solution that enables correction of, or at least alleviation of effects from, intensity inhomogeneity in an image acquired from a magnetic resonance imaging system.

In difference with other acquisition methods phase sensitive reconstruction, such as the two point Dixon method can provide pure fat and water volumes. Therefore there is typically no problem in distinguishing different tissues in the same volume. It has been found that one efficient way to correct for intensity inhomogeneity in image volumes acquired with using e.g. a two point Dixon technique is to locate voxels corresponding to pure adipose tissue and estimate a correction field from these points. A method has been developed addressed to this idea.

The invention is defined by the appended independent claims. Preferred embodiments are set forth in the dependent claims and in the following description and drawings.

Hence, according to a first aspect, there is provided a method of producing an image with a magnetic resonance imaging system according to claim 1, and, according to a second aspect, a magnetic resonance imaging system according to claim 15. This iterative approach enables chemical shift artifact correction without significant SNR degradation.

Preferred embodiments relating to the third and fourth aspect follow from claims 2-13.

According to a third aspect, there is provided a method of producing an intensity correction field with a magnetic resonance imaging system, according to claim 16 and according to a fourth aspect, a magnetic resonance imaging system according to claim 30.

The third aspect method has several applications. It can be in accurate fat content estimation enabling integration of fat in the image avoiding partial volume effects. Application of the correction field to the reconstructed water image provides an intensity reference which is stable also after contrast agent injection as the contrast influence on the fat signal is negligible.

Preferred embodiments relating to the third and fourth aspect follow from claims 17-29.

The intensity correction field can preferably be used to correct any image acquired using the MRI system that provided data from which the intensity correction field was generated, i.e. any image from the same image data set and/or from any other image data set.

Obesity is today a growing problem in many parts of the world. It is generally considered that the unfavorable prognosis in sedentary subjects with abdominal obesity is due to large amounts of intra abdominal fat. To study such effects, the method according to the third aspect can be extended according to what is disclosed in claims 19-20 and thereto dependent claims. This enables to quantitatively measure the abdominal fat composition from MR images. Three different types of fat: subcutaneous, visceral and non-visceral internal are advantageously measured. In order to avoid operator dependence and extensive manual work, thereby enabling larger studies, the method can be fully automated. This distinguishes it from most previously published methods. Furthermore, the method allows to quantitatively measure the fat content in each individual voxel in order to avoid partial volume effects.

BRIEF DESCRIPTION OF THE DRAWINGS

The above, as well as other aspects, objects, features and advantages of the present invention, will be better understood through the following illustrative and non-limiting detailed description, with reference to the appended schematic drawings.

DESCRIPTION OF PREFERRED EMBODIMENTS

Chemical Shift Artifact Correction

Figure 1A:
FIG. 1a-f schematically show different exemplary signals in 2-point Dixon imaging.
Figure 1B:
Figure 1C:
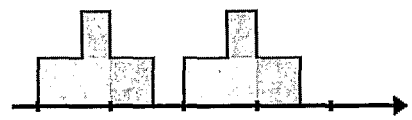
Figure 1D:
Figure 1E:
Figure 1F:

FIG. 1a-f schematically show different exemplary signals in 2-point Dixon imaging, where FIG. 1a shows a water signal, FIG. 1b shows a fat signal, FIG. 1c shows an in-phase signal, FIG. 1d shows an out-of-phase signal, FIG. 1e shows a reconstructed water signal and FIG. 1f shows a reconstructed fat signal. The signals from a two point Dixon acquisition after phase sensitive reconstruction can be described as:

$$IP(x)=W(x)+F(x)*\delta(x+WFS) \quad (1)$$

$$OP(x)=W(x)-F(x)*\delta(x-WFS) \quad (2)$$

where $\delta$ is the Dirac delta function, W the water signal, F the fat signal and WFS the water-fat shift. The asterisk * in the equations defines a convolution. Combing the IP and OP signals should ideally provide separate water and fat volumes as in FIGS. 1a-b, but the spatial misregistration introduced by the chemical shift artifact leads to (FIGS. 1e-f):

$$IP(x)+OP(x)=2W(x)+F(x)*\delta(x+WFS)-F(x)*\delta(x-WFS) \quad (3)$$

$$IP(x)-OP(x)=F(x)*\delta(x+WFS)+F(x)*\delta(x-WFS) \quad (4)$$

The consequence of the artifact is a low pass filtering effect in the extracted fat volume and a derivative contamination effect of the true fat signal in the extracted water volume. The water fat shift WFS is known, which means that it can be compensated for, creating synthetic in-phase (IP') and out-of-phase (IP') volumes tuned at the methylene lipid frequency:

$$IP'(x)=IP(x)*\delta(x-WFS)=W(x)*\delta(x-WFS)+F(x) \quad (5)$$

$$OP'(x)=OP(x)*\delta(x+WFS)=W(x)*\delta(x+WFS)+F(x) \quad (6)$$

These equations yield alternative expressions for fat and water:

$$IP'(x)+OP'(x)=W(x)*\delta(x+WFS)+W(x)*\delta(x-WFS) \quad (7)$$

$$IP'(x)-OP'(x)=2F(x)+W(x)*\delta(x-WFS)-W(x)*\delta(x+WFS) \quad (8)$$

From (3) and (8) expressions for true fat and water signals can be extracted to create:

$$W(x) = \frac{IP(x) + OP(x)}{2} - K\frac{F(x)*\delta(x+WFS) - F(x)*\delta(x-WFS)}{2} \quad (9)$$

$$F(x) = \frac{IP'(x) - OP'(x)}{2} - K\frac{W(x)*\delta(x-WFS) - W(x)*\delta(x+WFS)}{2} \quad (10)$$

The constant K is introduced for stabilization purposes. Since the true fat signal is unknown the extracted low pass filtered fat volume from the Dixon method can be used as an initial guess. Based on the above, the following correction scheme can be derived:

Step 1
Set the initial fat value:

$$F(x) = \frac{IP(x) - OP(x)}{2} \quad (11)$$

Step 2
Calculate the new water value from (9):

$$W(x) = \frac{IP(x) + OP(x)}{2} - K\frac{F(x)*\delta(x+WFS) - F(x)*\delta(x-WFS)}{2} \quad (12)$$

Step 3
Calculate the new fat value from (10):

$$F(x) = \frac{IP'(x) - OP'(x)}{2} - K\frac{W(x)*\delta(x-WFS) - W(x)*\delta(x+WFS)}{2} \quad (13)$$

Repeat from step 2 until a specified criterion is met or a defined number of iterations are reached.

It is realized that the factors (IP+OP)/2 and (IP'−OP')/2 in expressions 12 and 13 do not change between iterations and thus can be seen as an uncorrected water signal $W_{uncorr}$ and uncorrected fat signal $F_{uncorr}$, respectively. In each iteration the uncorrected signals $W_{uncorr}$ and $F_{uncorr}$ can be seen as being corrected by the factors in expressions 12 and 13 comprising the constant K, which factors thus can be seen as a water signal correction factor $W_{corr}$ and fat signal correction factor $F_{corr}$, respectively. Hence, expressions 11-13 and the iterative approach, can be described by the following expressions and steps:

a) $F_n=(IP-OP)/2, n=0;$  (14)

b) $W_{n+1}=W_{uncorr}-W_{corr}(F_n);$  (15)

c) $F_{n+1}=F_{uncorr}-F_{corr}(W_{n+1});$  (16)

$n=n+1;$ d) Repeat from b) until a specified criterion is met or a defined number of iterations are reached.

Although the examples herein are mainly based on a water-fat situation where the water resonance frequency is the "in phase"-reference frequency, which normally is the case, it is understood that the solution that has been presented is not dependent on this and applicable to also other situations. From the physics and mathematics underlying the presented solution it is clear, since neither physics nor mathematics is dependent on what name things have been given, that the solution is applicable also when e.g. fat is the "in-phase"-reference, or in any situation of MRI compatible first and second signals with different resonance frequencies.

Figure 2:
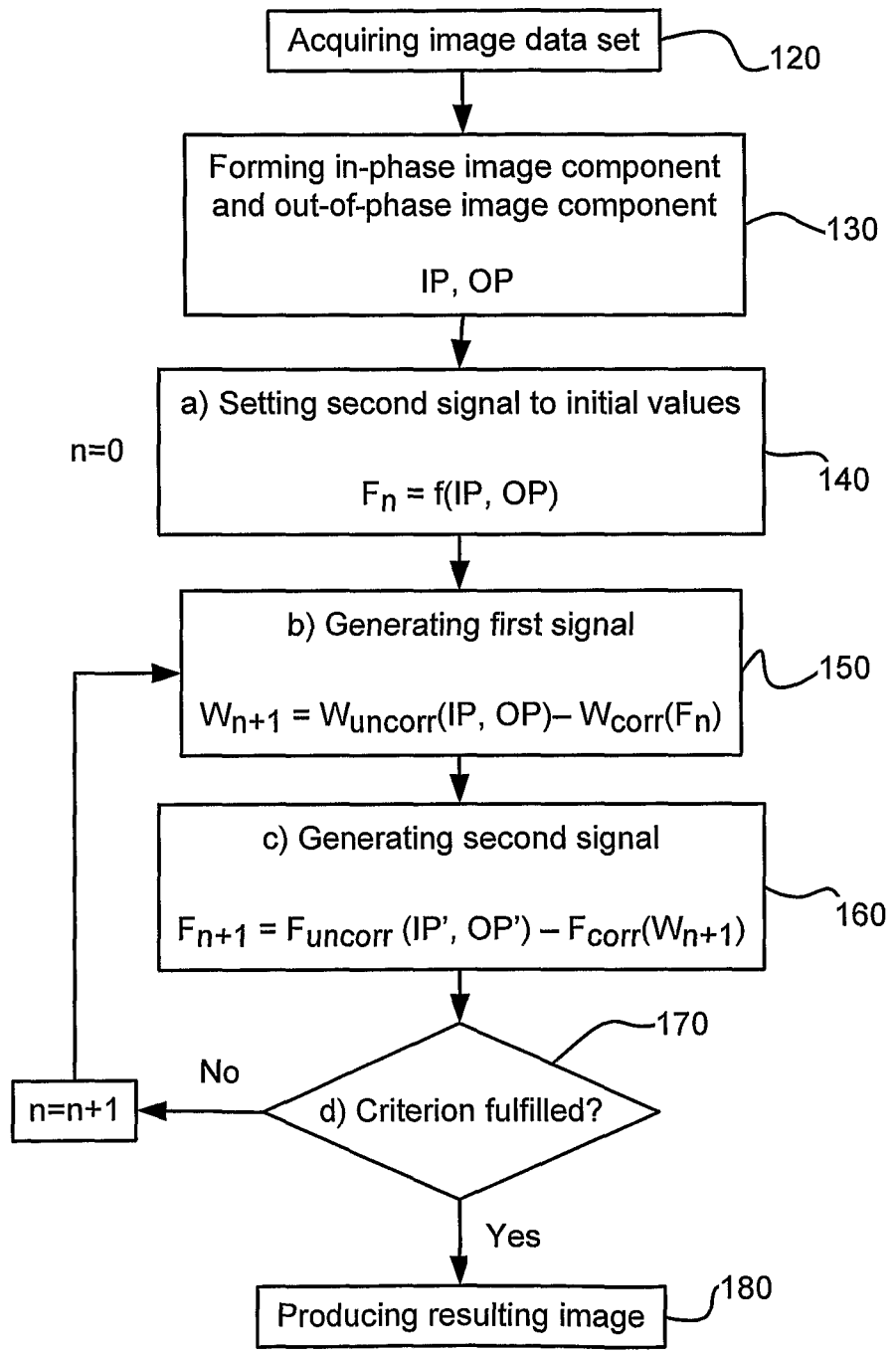
FIG. 2 schematically shows steps of one embodiment of a method of producing an image with a magnetic resonance imaging system.

FIG. 2 schematically shows steps of one embodiment of a method of producing an image with a MRI system. In a first step 120 an image data set is acquired with the MRI system and in step 130 in-phase and out of phase image components IP, OP are formed from the data set. Then follows steps 140-180 corresponding to the above-described steps a)-d).

In step 140, a second signal, for example a fat signal $F_n$, is set to initial starting values in order to have something to start from. The initial values are being guessed, but it is understood that it is typically preferred that the initial values are equal to or close to what can be derived from the in-phase component IP and the out-of-phase component OP without any compensation for the chemical shift artifact involved, i.e. that the fat signal $F_0$ initially is a function of IP and OP, e.g. $F_0=(IP-OP)/2$, as in step a).

In step 150 a first signal is generated using the second signal (set to the initial values or calculated in a previous iteration), for example a water signal $W_{n+1}$ is calculated using the fat signal $F_n$ as in step b).

In step 160 a second signal is generated using the first signal (calculated in step 150), for example a fat signal $F_{n+1}$ is calculated using water signal $W_{n+1}$ as in step c).

In step 170 it is checked if a criterion is fulfilled, typically whether a predetermined number of iterations have been reached or not, which can be accomplished by checking the value of an integer parameter n. If the criterion has been met, a resulting image is produced in step 180, which resulting image has a corrected, or at least reduced, chemical shift artifact, the resulting image being for example a fat image, a water image, or a joint image thereof. If the criterion has not been met, the integer parameter n can be increased by one and a next iteration is started from step 150.

Figure 3:
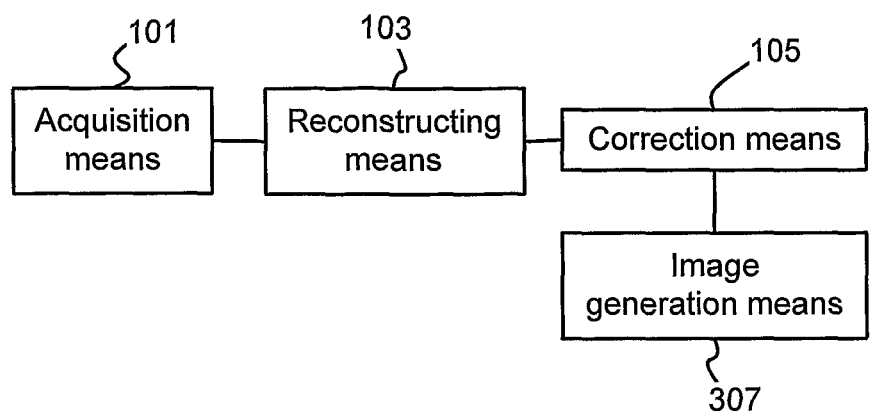
FIG. 3 schematically illustrates one embodiment of a magnetic resonance imaging system.

FIG. 3 schematically illustrates one embodiment of a MRI system configured so that it can carry out the method discussed above. The system comprises acquisition means 101, for example computer controlled data acquisition hardware connectable to a magnet assembly, configured to acquire the image data set, i.e so that it can carry out step 120, and reconstruction means 103, e.g. a computer, configured, preferably by software, to form an in-phase image component and out-of-phase image component from the acquired data set, i.e. so that it can carry out step 130. Additionally the system comprises correction means 105, also typically a computer, which is configured, preferably by software, to compensate for a chemical shift artifact iteratively and generate compensated first and second signals, i.e. configured so that it can carry out steps 140-170. An image generation means 107 is configured to produce a resulting image based on the compensated first and/or second signal, i.e. configured so that it can carry out step 180, and is also typically a computer configured by software. The computers referred to as examples can be the same or separate computers, and may be general or specific purpose computers in terms of software and/or hardware.

Evaluation 1

A simulated, one dimensional object containing fat and water has been used for evaluation of the method using an embodiment based on the correction scheme according to expressions 11-13. The limited resolution compared to the WFS of the image was introduced by convolution of the simulated object with a sinc function multiplied with a hamming filter. In the simulations a WFS of 0.415 was used, this since the WFS in most applications, due to physical constraints, is approximately 0.4-0.5 pixels at 1.5 T if the lowest possible bandwidth and the shortest possible out of phase and in phase echo times are used for the desired resolution. The obtained IP and OP images were calculated. Water and fat signals obtained without WFS correction were compared to correspondingly corrected water and fat signals, and residuals were studied using 15 iterations and K values of 0.80. and 0.95.

The corrected water and fat signal of the simulated object showed clear improvements compared with the originally reconstructed signals. The low pass filtering effect in the fat signal and ringing artifacts around fat objects in the water signal was removed when high values of the constant K was used.

Evaluation 2

The influence of noise was analyzed for the method using an embodiment based on the correction scheme according to expressions 11-13.

This study was made by I) adding Gaussian noise to real valued IP and OP images which were created without any water and fat signal and II) using Gaussian noise with different amplitude as water and fat signal. The effect of different number of iterations, the constant, K, and the impact of noise at different SNR, were evaluated by calculating the standard deviation, SD, of the corrected water image residual, (obtained from the difference of the obtained water signal after correction and the original water signal used for generation of the signals in the simulation). Additionally, III) the SD in an corrected in vivo image was calculated in a region of interest (ROI) placed in homogenous liver tissue and was compared to the SD in a corresponding uncorrected image.

In the evaluation according to I), values resulting from $(SD_{corrected}-SD_{uncorrected})/SD_{uncorrected}$ were plotted for 5, 10, 15, 30 and 60 iterations as function of K. The simulation showed that the method is stable for all K<1, however, a noise amplifying effect was seen for K>0.8 and a low pass filtering effect for 0<K<0.8. 15 iterations was sufficient to reach a stable solution when K≤0.95.

In the evaluation according to II), K was kept in the range 0 to 1. Gaussian noise where added to the IP and OP providing a signal to noise ratio in the IP images of 0, 0.5, 1, and 5, where SNR was defined as the SD of the noise amplitude in the water and fat images divided by the SD of the noise added to the IP and OP images. Also here $(SD_{corrected} - SD_{uncorrected})/SD_{uncorrected}$ were plotted using 15, 30 and 60 iterations. The convergence rate decreased for higher values of K. High SNR signals appeared to be most effectively corrected using K values close to 1 as the noise amplification effect becomes insignificant. At lower SNR the optimal values of K appeared to become lower. 15 iterations were sufficient to reach convergence also for signal with higher SNR. For high SNR signals usage of higher K values can be used to obtain optimal correction.

In the evaluation according to III) a lower influence on the SD were observed probably owing to different noise characteristics.

Evaluation 3

Also here the method using an embodiment based on the correction scheme according to expressions 11-13 was evaluated. Data acquisition, phase sensitive reconstruction and solver implementation OP and IP images were acquired at TE 2.3 ms and 4.6 ms with a Achieva 1.5 T (Philips Medical Systems, Best, The Netherlands) MR-scanner. A standard THRIVE pulse sequence (fat suppressed, radial sampling and three dimensional turbo field echo acquisition) were adjusted by removing the fat suppression and adding an extra reversed echo read out. The images were acquired in a 23 s breath hold using a four element sense body coil from a healthy volunteer. 40 slices using a slice thickness of 4 mm were acquired using an in-plane resolution of 2×2 mm2, the WFS was 0.415 pixels, TEOP was 2.3 ms, TEIP was 4.6 ms and TR was 6.5 ms. All images were interpolated to a 1×1 mm$^2$ in-plane resolution and a slice thickness of 2 mm. Phase corrected IP and OP images were obtained using a three dimensional version of the anti gradient method, see e.g. J. Rydell, H. Knutsson, J. Pettersson, A. Johansson, G. Farnebäck, O. Dahlqvist, P. Lundberg, F. Nyström, and M. Borga, "*Phase sensitive reconstruction for water/fat separation in MR imaging using inverse gradient,*" in International Conference on Medical Image Computing and Computer-Assisted Intervention (MICCAI'07), Brisbane, Australia, October 2007, and Rydell J, Johansson A, Dahlqvist Leinhard O, Knutsson H, Farnebäck G, Lundberg P, Borga M. *Three dimensional phase sensitive reconstruction for water/fat separation in MR imaging using inverse gradient*. In Proceedings of the International Society for Magnetic Resonance in Medicine annual meeting (ISMRM'08) Toronto, Canada: ISMRM, 2008.

After the application of the iterative solver, i.e. the correction scheme, corrected IP and OP images were calculated using a range of K values from 0.5 to 1.05 and 15 iterations. The iterative solver was implemented in Matlab (The MathWorks, Inc, Massachusetts, USA). Before application of the iterative part of the correction scheme, the images were interpolated to a pixel spacing exactly matching the water fat shift using a fast Fourier transform (FFT) based interpolation method. After this operation all convolutions in the iterative method were performed using one pixel shifts of the signals, thus without need of any further interpolation. It is realized that such interpolation before application of the iterative part of the method in general is beneficial since it e.g. allows for simpler and faster implementation.

The corrected water images showed visible improvements compared to the original images. Most evident were effects in an outer skin layer but were also apparent in the region around the spine. The effects in the fat images were harder to distinguish by visual inspection but by looking at a difference image, the sharpening effect of the iterative reconstruction algorithm becomes evident. Most apparent were the effects of the correction in a corrected in-phase image where the fat/water displacement artifact and the edge artifact around fat objects were removed.

Original and reconstructed in-phase, water and fat images after chemical shift artifact correction using 15 iterations and K=0.84 and K=0.95, were studied together with difference images created by taking corrected image–original image. Line plots of water and fat signal intensities before and after correction were also studied. Removal of edge amplification artifacts, improvement of the peak amplitude in corrected thin fat structures (approximately 5-10% increase), and removal of negative signal dip around fat structures, were observed. Also line plots of water and fat signal before and after correction using K=0.95 and K=0.80 were studied. Removal of edge amplification artifact occurring close to fat structures, removal of low pass filtering effect in the fat image and increase of peak amplitude in thin fat structures (by 5-10%) were observed. Comparison were also made with an image acquired using the prior art "fly back"-method. The SD of a difference image between a "fly-back" water signal and a corrected water signal was 27% lower compared to the SD of the difference image between the "fly-back" water signal and an uncorrected water signal when measured in all slices excluding voxels outside the body.

Conclusions from the foregoing includes that the disclosed method has the effect of reducing chemical shift artifacts, that is exhibits rapid convergence and low computational requirements. Since one advantage the iterative method presented herein has over the "fly-back"-method, is the capability to obtain high SNR, embodiments resulting in significant SNR losses are typically of less interest. In this respect one optimal value of the stabilization constant K has been found for K=0.80. At this point the high pass filtering effect of the method have been observed to be cancelled by the low pass filtering effect at lower K values. Another perspective of the choice of optimal constant K is that the increase of noise amplitude should be significantly lower compared to the SD increase obtained using the "fly-back"-method, which results in that higher values of K may be used in order to obtain a more effective correction. At such higher values, K=0.95 may be used since simulations at this value resulted in a similar SNR as the "fly-back"-method and the in vivo measurements gave approximately a 5% increase in SD. However, in general, to find an optimal value one should consider the exact noise characteristics of the images reconstructed from the MR-scanner.

After correction of water and fat images it is possible to calculate not only pure water and fat images but also in- and out of-phase images without influence of the water-fat shift artifact. One advantage the iterative method presented herein has over other MR-techniques is that the artifact influence can be reduced in a rapid manner.

In this work we have used the a phase sensitive reconstruction method based on calculation of the inverse gradient field (see J. Rydell, H. Knutsson, J. Pettersson, A. Johansson, G. Farnebäck, O. Dahlqvist, P. Lundberg, F. Nyström, and M. Borga, "*Phase sensitive reconstruction for water/fat separation in MR imaging using inverse gradient,*" in International Conference on Medical Image Computing and Computer-Assisted Intervention (MICCAI'07)) generalized to solve the phase field in three dimensions (see Rydell J, Johansson A, Dahlqvist Leinhard O, Knutsson H, Farnebäck G, Lundberg P, Borga M. *Three dimensional phase sensitive reconstruction for water/fat separation in MR imaging using inverse*

*gradient. Proceedings of the International Society for Magnetic Resonance in Medicine annual meeting (ISMRM'08) Toronto, Canada: ISMRM, 2008).* However, application of the iterative correction method presented herein is independent of the method used for estimation of the phase correction field.

The application of this method to bipolar three point Dixon acquisition schemes should be straightforward but has not been investigated in detail. A possible improvement of the method can be to enable variable amplitude of the constant K in different regions of the image. From the foregoing one can note that K=0 means that the water image is calculated from IP+OP and the fat image is calculated from IP'−OP' and is therefore not equal to the result from the original Dixon reconstruction where the fat image is somewhat low pass filtered. This is to the cost of introduction of artifacts originating from water edges. An optimal solution can therefore probably be described using high K values in regions where the SNR of the other signal component is high and low in regions where the SNR is low and a noise amplifying effect is expected by the correction.

Intensity Inhomogeneity Correction

Figure 4:
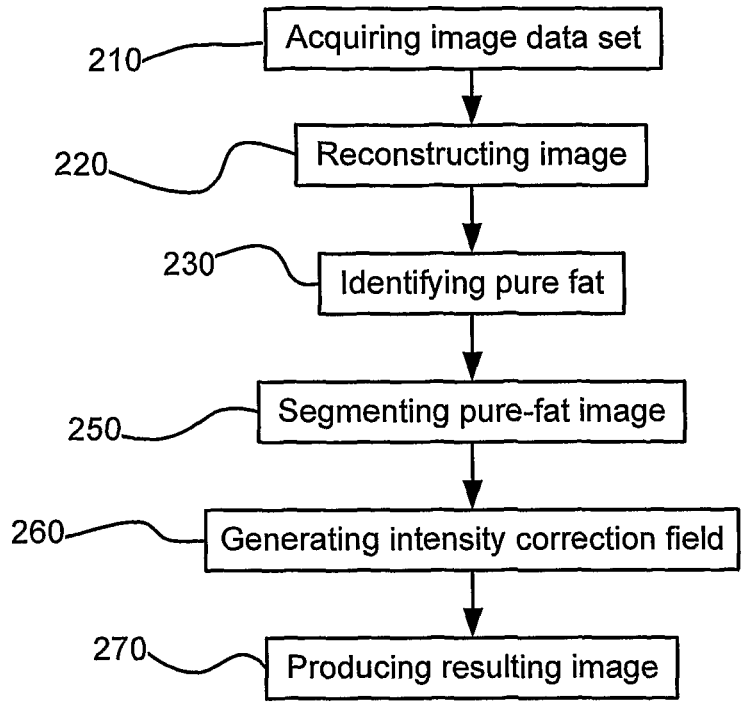
FIG. 4 schematically shows steps of one embodiment of a method of producing an intensity correction field with a magnetic resonance imaging system.

FIG. 4 schematically shows steps of one embodiment of a method of producing an intensity correction field with a magnetic resonance imaging (MRI) system. In a first step 210 an image data set is acquired using the MRI system. In a second step 220 an image is reconstructed based on the acquired image data set, the image containing water and fat phase information represented by an in-phase component IP and an out-of-phase component OP. The acquisition and reconstruction is preferably made by two-point Dixon imaging. However, there are also variants of the above-described Dixon imaging, which, as will be realized by the skilled person, are compatible with the solutions presented herein, e.g. three-point Dixon imaging, or any other technique resulting in-phase and out-of phase components. Additionally, there are also other ways of measuring fat content using MRI. For example, since the T1 relaxation time of adipose tissue is shorter than that of most other types of tissue, segmentation of T1 weighted images is commonly used. However, due to partial volume effects, this technique has been shown to consistently underestimate the fat volume.

After steps 210 and 220 follows step 230 where pure-fat image points, here pure adipose tissue voxels, are identified, thus producing a pure-fat image. The intensity non-uniformity in the in-phase volume, IP, and extracted fat volume, F, are typically close to equal. By calculating a relative fat content $F_r$, i.e. an F/IP ratio, an estimate of fat content relative to water content can be reached without the impact of intensity non-uniformity, i.e. the relative fat content can be seen as insensitive to intensity variations. As pure adipose tissue is known to result in about 90% signal in the fat image and in about 10% signal in the water image, a thresholding, which can be made simple, of the relative fat content can be used to identify and collect pure adipose tissue voxels. (In the absence of intensity non-uniformities, all such voxels would have the same intensity in e.g. the in-phase image IP.) Voxels entirely located outside the body are preferably removed. Thus the intensity variations can be estimated by examining voxels which are located inside the body and have high relative fat content $F_r$ values.

Other test criterions than thresholding includes e.g. morphological operators, such as a requirement that a voxel to be accepted must belong to a fat structure of a certain size and/or shape. Other test criterion might be based on the combination of Dixon encoding of MR-images with other MR-pulse sequences providing multiple images with different contrast properties.

An additional masking may be used to only account for values in human tissue. This can be made by an initial thresholding operation with an empirically determined threshold for background values. That is, an additional criterion to separate true fat voxels from false positives caused by low signal intensity in the both the fat and the in phase image may be used to only account for values in human tissue.

Then follows step 250 where the pure-fat image is segmented, preferably by bimodal segmentation. Bimodal segmentation means a process to determine an appropriate thresholding value based on a bimodal model of the signal distribution.

In step 260 an intensity correction field is generated by interpolating a fat image F, which is based on the in-phase component IP and the out-of-phase component OP, using the segmented image, i.e. a field is interpolated from the identified voxels. When the adipose tissue voxels have been identified the correction field is preferably created with normalized convolution, see e.g. H. Knutsson and C-F. Westin. *In Proc. of IEEE Computer Society Conference on Computer Vision and PatternRecognition*, June 1993, pp. 515-523, where pure fat voxels are weighted as 1 and remaining voxels as 0. It is also possible to weight using a wider range of values, and e.g. non-integer values, and e.g. apply .values from a, or weighted with values from a wider range, e.g. a non-integer value from a pre-defined range. The intensity non-uniformity typically varies slowly over the image, i.e. the spatial intensity variation is typically slow, and thus a full non-uniformity map can be obtained by interpolation of the intensity of those voxels using normalized convolution. Convolving with a Gaussian smoothing kernel is preferred since it suppresses noise at the same time as the correction field is interpolated from the collected points.

In step 270, a resulting, and thus intensity corrected, image is produced, which may involve applying the intensity correction field to the in-phase and out-of phase image components, IP and OP. Hence, a volume can be reconstructed. For example, an extracted fat volume can be divided by the calculated intensity non-uniformity field, i.e. the intensity correction field, to acquire an intensity normalized volume. Water W and fat F images can be corrected by multiplication with the inverse of an intensity non-uniformity map corresponding to the intensity correction field. Application of the correction field to the reconstructed water image provides an intensity reference which is stable also after contrast agent injection as the contrast influence on the fat signal is negligible. Hence, the generated intensity correction field can be used as a reference and can be used to correct not only the fat image, but also the water image, and also images originating from other image data sets acquired using the MRI system.

Figure 5:
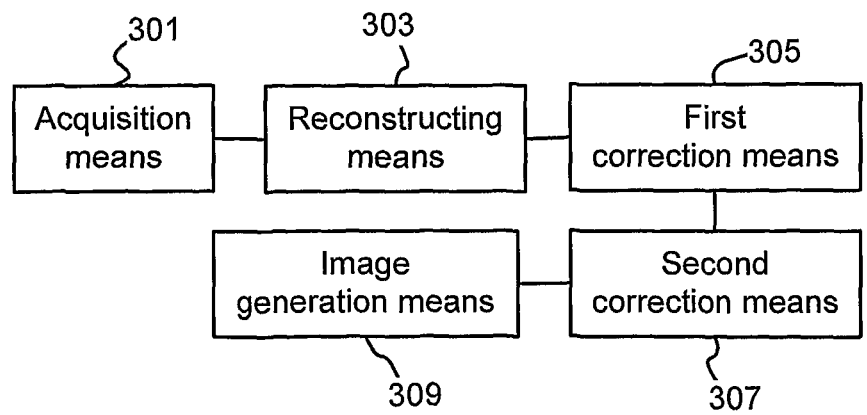
FIG. 5 schematically illustrates one embodiment of a magnetic resonance imaging system.

FIG. 5 schematically illustrates an embodiment of a magnetic resonance imaging (MRI) system configured so that it can carry out the method discussed above. The system comprises acquisition means 301, for example computer controlled data acquisition hardware connectable to a magnet assembly, configured to acquire the image data set, i.e. so that it can carry out step 210, and reconstruction means 303, e.g. a computer, configured, preferably by software, to reconstruct the image based on the acquired image data set, i.e. so that it can carry out step 220. Additionally the system comprises a first correction means 305, also typically a computer, which is configured, preferably by software, to compensate for the intensity inhomogeneity, i.e. configured so that it can carry out steps 230-260. A second correction means 307 is configured to generate the intensity correction field, i.e. so that can carry out step 260, and which also typically is a computer that has been programmed by software. An image generation means 309 is configured to apply the intensity correction field to produce an resulting image, i.e. that can carry out step 270 and is also typically a computer configured by software. In another embodiment there may be no image generation means 309, in such embodiment the intensity correction field can be saved on storing means, e.g. as a file on a disk drive, for later use. In one embodiment the correction field is applied by another image generation means, which may be separate.

In one experiment, data acquisition and water/fat separation: 50 volumes from 20 different patients were acquired. Single breath hold (28 s) multi-slice MR-images were collected out of and in phase (TE=2.3 and 4.6 ms) using a 1.5 T MR-scanner (Philips Medical systems, Best, the Netherlands). Slice thickness was 5 mm and the field of view was 290×200×410 mm (ap, fh, rl). TR was 286 ms and the flip angle was 80 degrees. The signal intensities were rescaled to the sensitivity of the quadrature body coil using constant level appearance (CLEAR) reconstruction and the inverse gradient method [5] was used for water and fat separation. RESULTS: The original and corrected fat and water images were normalized with a fat peak value corresponding to a hundred percent adipose tissue. Peak values were obtained by histogram analysis of voxels in the fat images in the subcutaneous region and the corresponding subcutaneous voxel histograms before and after intensity normalization are presented in FIGS. 2.3a-b. An evident improvement could be seen in the corrected fat image. Similar improvement was seen inter slices and was most apparent close to the edges of the reception coil.

Figure 6A:
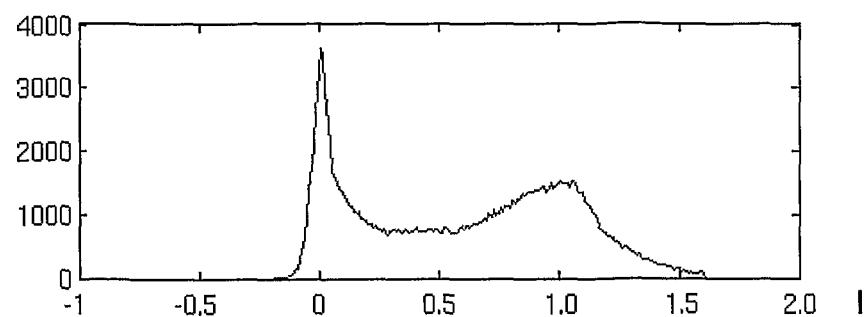
FIG. 6a-b show fat signal histograms before and after intensity correction resulting from an experiment using a method according one embodiment.
Figure 6B:
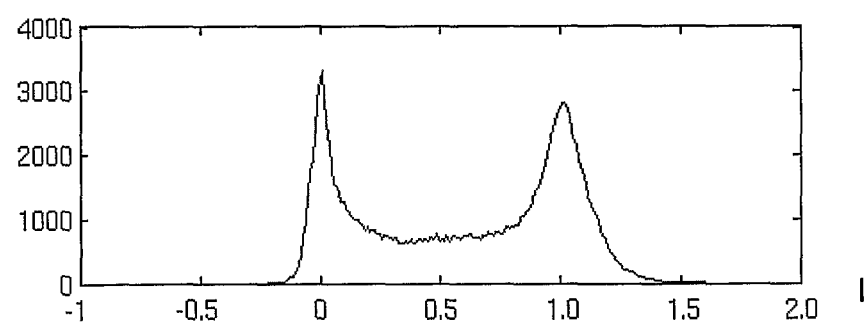

Hence, to sum up, a simple and efficient solution that can be used to account for intensity inhomogenity in two point Dixon imaging is to identify pure adipose tissue values and estimate a correction field by normalized convolution. The method has shown good stability in the evaluation of 50 datasets. After application of the correction field there are noticeable signs that imply that the intensity distribution over the volume has improved. Intensity variations seen inter and intra slices was efficiently eliminated. Looking at the subcutaneous fat histogram (see FIG. 6b) for all voxels after intensity non-uniformity correction and comparing to a corresponding histogram without the correction (see FIG. 6a), a distinctive peak for pure adipose tissue can be seen without dispersing effects caused by intensity variations.

The above described method may advantageously be adapted to or used in a fat quantification method that can be used for automatic quantification of subcutaneous, visceral and non-visceral internal fat from MR-images acquired using the two point Dixon technique in the abdominal region. The fat quantification method includes (1) a three dimensional phase unwrapping to provide water and fat images, (2) an image intensity inhomogenity correction (as in the method described above), and (3) a non-rigid registration and segmentation of the tissue. This is followed by an integration of the corrected fat images within the different fat compartments that avoids the partial volume effects associated with traditional fat segmentation methods. In other words, the fat quantification method comprises a number of different steps: Phase correction of two point Dixon images, intensity inhomogenenity compensation and segmentation of the different types of fat.

In practice, magnetic field inhomogeneties cause the complex phase of IP and OP from Dixon imaging to vary over the images and a phase correction may be needed before W and F can be calculated. Several different methods for correcting Dixon images have been proposed in e.g. *J. Ma. Magnetic Resonance in Medicine*, vol. 52, no. 2, pp. 415-419, 2004, S. M.-H. Song et al. *IEEE Transaction on Image Processing*, vol. 4, no. 5, pp. 667-676, May 1995, and E. M. Akkerman and M. Maas. *In Proc. of the ISMRM Annual Meeting*, Nice, France, 1995, ISMRM, p. 649. In experiments the method introduced in J. Rydell, et al. *Med Image Comput Comput Assist Interv Int Conf Med Image Comput Comput Assist Interv.* 2007;10(Pt 1):210-8. and in Rydell J et al. *In Proc. of the Int. Soc. for Magn. Res. In Med. annual meeting* (ISMRM'08). Toronto, Canada:ISMRM, 2008, has been applied for phase correction, which method has been shown to perform well even in the presence of severe phase artifacts. Hence, in the fat quantification method, step 210 of the previously described method is extended to encompass phase correction.

In MRI the inhomogeneous sensitivity of the RF-coils cause variations in the image magnitude over the field of view. The variation in sensitivity affects the signal strength within the 3D volume and furthermore it makes comparison of signal intensities between different examinations difficult. This non-uniformity degrades the quality of the fat content estimation, and therefore needs to be avoided, which is one reason why the method of intensity correction described in the foregoing is advantageous to use with the fat quantification method.

Preferably non-rigid registration is used for atlas based segmentation. One such non-rigid registration method is the Morphon, see e.g. H. Knutsson and M. Andersson. In *IEEE International Conference on Image Processing* (ICIP'05), Genova, Italy, September 2005. In non-rigid registration, a prototype image is registered to a target image by iteratively deforming the prototype. The deformation estimate is calculated by maximization of the similarity between the prototype and the target. The similarity measure can be based on e.g. image intensity or local phase information. The latter has the main advantage of being invariant to intensity variations between images. Hence, a phase based approach is preferably used.

In an application of abdominal registration, the morphon was used to segment the abdominal adipose tissue into three different types: subcutaneous, visceral and internal non-visceral. This was done by registering a manually segmented prototype to the target image of interest. Registration of an abdominal prototype to a fat image in the abdominal region can be difficult due to the high variability in fat accumulation between different subjects. A significant advantage of the phase sensitive Dixon reconstruction is that separate fat and water images can be obtained. Since the water image contains structures such as muscles, bone and spine, with less variability than adipose tissue structures, it was a preferable choice over the fat image for registration intents. However, the water image also contained troublesome areas with high variability. This may cause significant degradation of the registration results. Normalized convolution with a certainty mask decreases the influence of these regions and improved the registration. To make the process of finding the internal and visceral masks more robust, the registration is divided into two steps. The first step registers a binary prototype to a roughly calculated binary mask of the internal region in the target image. This registration is applied on a coarse scale to provide a good initial guess of the global deformation. When the first step is finished, the resulting deformation field is applied on the second prototype, created from the water image, before proceeding to the finer resolution scales. An additional certainty mask, covering the muscle and bone structures in the abdominal region, is created to reduce the effects of uncertain regions on the registration result. Finally, masks of the visceral and nonvisceral regions are defined for the prototype image. These are used in the segmentation step to label the different compartments of the target image. Before the registration is launched, the target image is subjected to initial pre-processing steps to create binary masks of the body and of the internal region for the initial registration step. The arms and background of the target image can efficiently be removed from the rest of the body using local thresholding. A local minimum can be expected between the body and arms, and this is used for segmentation of the body. Removing everything except the largest connected component leaves a body mask that is further processed by morphological operations to produce a dense mask. After the registration has been performed, the calculated deformation field is applied to the labels associated with the prototype image. Hence, the fat in the target image is labeled as visceral and internal nonvisceral parts. Any adipose tissue not associated with any of these labels belongs to the subcutaneous fat. Since Dixon imaging provides separate water and fat images, no segmentation is needed to distinguish between these types of tissue. The purpose of the segmentation process is to separate the adipose tissue into different compartments.

The fat quantification method presented herein provides good segmentation results also when the target image differs substantially from the prototype. One aspect of the method is that the registration of the prototype to the target volume is performed exclusively on the water images eliminating the registration errors from the subcutaneous fat. A validation has shown a very strong reduction of the signal intensity variations within and between different subjects. This means that method provides very accurate integration of the fat content within the different compartments avoiding the partial volume effects associated with methods based on summation of voxels segmented in strongly T1 weighted images.

The drawings and the foregoing description are to be considered exemplary and not restrictive. The invention is not limited to the disclosed embodiments. For example, in the foregoing, acquisition and reconstruction has mainly been exemplified according to two-point Dixon imaging, however, as is realized by the skilled person, also three-point Dixon imaging and other phase sensitive acquisition and reconstruction methods can be used.

The present invention is defined by the claims and variations to the disclosed embodiments can be understood and effected by the person skilled in the art in practicing the claimed invention, for example by studying the drawings, the disclosure and the claims. Reference signs in parenthesis in the claims are exemplary and not restrictive. Occurrence of features in different dependent claims does not exclude a combination of these features.

The invention claimed is:

1. A method of producing an image with a magnetic resonance imaging system, the method comprising:
   acquiring an image data set with the magnetic resonance imaging system,
   forming an in-phase image component and an out-of-phase image component from the acquired image data set, each component comprising first and second signal information;
   compensating for a chemical shift artifact by:
   a) setting a second signal to initial values using said in-phase image component and said out-of-phase image component,
   b) generating a first signal using a first signal correction factor based on the second signal,
   c) generating a second signal using a second signal correction factor based on the first signal,
   d) repeating steps (b) and (c) until a predefined criterion is fulfilled; and
   producing, based on the first signal and/or the second signal, at least one resulting image representing at least one of:
   a first signal image,
   a second signal image, and
   a joint image representing both the first and the second signal.

2. The method as claimed in claim 1, wherein the predefined criterion is a predefined number of iterations, preferably at least 5, or at least 15.

3. The method as claimed in claim 1, wherein the first signal correction factor comprises a second signal difference between a positive shift of the second signal and a negative shift of the second signal, and the second signal correction factor comprises a first signal difference between a negative shift of the first signal and a positive shift of the first signal, a magnitude of each of said positive and negative shifts corresponding to a chemical shift.

4. The method as claimed in claim 3, wherein the first signal correction factor further comprises a constant multiplied with half of the second signal difference, and the second signal correction factor further comprises said constant multiplied with half of the first signal difference, said constant being less than 1 and greater than 0.

5. The method as claimed in claim 4, wherein the constant is at least about 0.8, or at least about 0.95.

6. The method as claimed in claim 4, wherein the constant is attributed an effective value with respect to noise characteristics of images reconstructed from the magnetic resonance imaging system.

7. The method as claimed in claim 4, wherein the constant is different in different image regions, preferably so that the constant has higher values in regions of higher signal-to-noise ratio, and lower values in regions of lower signal-to-noise ratio.

8. The method as claimed in claim 1, wherein
   step b) of generating a first signal further comprises:
   calculating a value based on an uncorrected first signal and the first signal correction factor, said uncorrected first signal being formed from the in-phase image component and the out-of-phase image component; and wherein
   step c) of generating a second signal further comprises:
   calculating a value based on an uncorrected second signal and the second signal correction factor, said uncorrected second signal being formed from a synthetic in-phase image component and a synthetic out-of-phase image component, said synthetic in-phase image component being based on a shift of the in-phase image component, and said synthetic out-of-phase image component being based on a shift of the out-of-phase image component, each of said shifts corresponding to a chemical shift.

9. The method as claimed in claim 1, wherein the chemical shift artifact is a water-fat shift artifact and the chemical shift is a water-fat shift.

10. The method as claimed in claim 1, further comprising:
    interpolating the in-phase image component and the out-of-phase image component to a pixel spacing matching a predetermined chemical shift, so that any chemical shift operation in steps a)-d) can be a one pixel shift.

11. The method as claimed in claim 1, wherein said first signal is any one of a water signal and a fat signal, preferably the water signal, and said second signal is the other one of the water signal and the fat signal, preferably the fat signal.

12. The method as claimed in claim 1, further comprising phase correction so that the in-phase image component and the out-of-phase image component are phase corrected before compensating for the chemical shift artifact.

13. A magnetic resonance imaging system, comprising:
acquisition means configured to acquire an image data set,
reconstruction means configured to form an in-phase image component (IP) and an out-of-phase image component from the acquired image data set, each component comprising first and second signal information;
correction means configured to compensate for a chemical shift artifact by:
a) causing a second signal to be set to predefined initial values using said in-phase image component and said out-of-phase image component;
b) causing a first signal to be generated using a first signal correction factor based on the second signal;
c) causing a second signal to be generated using a second signal correction factor based on the first signal;
d) causing steps (b) and (c) to be repeated until a predefined criterion is fulfilled, and
image generation means configured to produce, based on the first signal and/or the second signal, at least one resulting image representing at least one of:
a first signal image,
a second signal image, and
a joint image representing both the first and the second signal.

14. A method of producing an intensity correction field with a magnetic resonance imaging system, the method comprising:
acquiring an image data set with the magnetic resonance imaging system;
reconstructing an image based on the image data set, the reconstructed image containing water and fat information, and the reconstruction being phase sensitive such that it results in an in-phase image component and an out-of-phase image component;
identifying image points in the reconstructed image which image points according to a test criterion represent pure fat tissue thus producing a pure-fat image;
segmenting the pure-fat image to produce a segmented image free from non-tissue image data; and
generating the intensity correction field by interpolating a fat image using the segmented image, said fat image being based on the in-phase image component and the out-of-phase image component.

15. The method as claimed in claim 14, wherein the method further comprises:
compensating for an intensity inhomogeneity in the reconstructed image by producing at least one resulting image by applying the intensity correction field to the in-phase and out-of-phase image components of the reconstructed image, the at least one resulting image representing at least one of:
a water image,
a fat image, and
a joint image representing both water and fat.

16. The method as claimed in claim 14, wherein the method further comprises
acquiring a second image data set with the magnetic resonance imaging system; and
reconstructing a second image based on said second image data set; and
compensating for an intensity inhomogeneity in the reconstructed second image by applying the intensity correction field to an image component of the second image.

17. The method as claimed in claim 14, wherein the step of reconstructing an image based on the image data set comprises phase correction of the in-phase image component and the out-of-phase image component.

18. The method as claimed in claim 15, further comprising registering and segmenting tissue using the at least one resulting image, said registering and segmenting being non-rigid.

19. The method as claimed in claim 14, wherein the step of identifying image points in the reconstructed image comprises estimating fat content relative to water content.

20. The method as claimed in claim 19, wherein estimating fat content relative to water content comprises calculating a relative fat content, that is a ratio between a fat image component and the in-phase image component.

21. The method as claimed in claim 14, wherein the test criterion in the step of identifying image points in the reconstructed image comprises thresholding, preferably thresholding of relative fat content.

22. The method as claimed in claim 14, wherein the step of segmenting the pure-fat image comprises bimodal segmentation.

23. The method as claimed in claim 14, wherein interpolating the segmented image in the step of generating an intensity correction field comprises normalized convolution.

24. The method as claimed in claim 23, wherein the normalized convolution comprises convolving with a Gaussian smoothing kernel.

25. The method as claimed in claim 14, wherein the step of acquiring an image data set and the step of reconstructing an image based on the image data, are performed using an image producing method in such way that the reconstructed image results from the resulting image being produced by the image producing method, the image producing method comprising:
acquiring an image data set with the magnetic resonance imaging system,
forming an in-phase image component and an out-of-phase image component from the acquired image data set, each component comprising first and second signal information;
compensating for a chemical shift artifact by:
a) setting a second signal to initial values using said in-phase image component (IP) and said out-of-phase image component,
b) generating a first signal using a first signal correction factor based on the second signal,
c) generating a second signal using a second signal correction factor based on the first signal,
d) repeating steps (b) and (c) until a predefined criterion is fulfilled; and
producing, based on the first signal and/or the second signal, at least one resulting image representing at least one of:
a first signal image,
a second signal image, and
a joint image representing both the first and the second signal.

26. A magnetic resonance imaging system, comprising:
acquisition means configured to acquire an image data set,
reconstruction means configured to reconstruct an image based on the acquired image data set, the reconstructed image containing water and fat phase information represented by an in-phase image component and an out-of-phase image component,
a first correction means configured to:
cause identification of image points in the reconstructed image which image points according to a test criterion represent pure fat tissue thus producing a pure-fat image, cause a segmented image to be produced based on the pure-fat image, the segmented image being free from non-tissue image data, and second correction means configured to generate an intensity correction field by interpolating a fat image using the segmented image, said fat image being based on the in-phase image component and the out-of-phase image component.

27. A magnetic resonance imaging system as claimed in claim 26, further comprising:

image generation means configured to apply the intensity correction field to the in-phase and out-of-phase image components of the reconstructed image, the at least one resulting image representing at least one of:

a water image, a fat image, and a joint image representing both water and fat, an image component of the second image.

28. A magnetic resonance imaging system as claimed in claim 26, further comprising:

acquisition means configured to acquire a second image data set;

reconstruction means configured to reconstruct a second image based on said second image data set; and image generation means configured to apply the intensity correction field to an image component of the second image.

29. A magnetic resonance imaging system, comprising:

computer controlled data acquisition hardware configured to acquire an image data set, a computer configured to form an in-phase image component (IP) and an out-of-phase image component (OP) from the acquired image data set, each component comprising first and second signal information;

the same or a separate computer configured to compensate for a chemical shift artifact by:

a) causing a second signal ($F_n$) to be set to predefined initial values using said in-phase image component (IP) and said out-of-phase image component (OP);

b) causing a first signal ($W_{n+1}$) to be generated using a first signal correction factor based on the second signal ($F_n$);

c) causing a second signal ($F_{n+1}$) to be generated using a second signal correction factor based on the first signal ($W_{n+1}$);

d) causing steps (b) and (c) to be repeated until a predefined criterion is fulfilled, and the same or a separate computer configured to produce, based on the first signal and/or the second signal, at least one resulting image representing at least one of:

a first signal image, a second signal image, and a joint image representing both the first and the second signal.

30. A magnetic resonance imaging system, comprising:

computer controlled data acquisition hardware configured to acquire an image data set, a computer configured to reconstruct an image based on the acquired image data set, the reconstructed image containing water and fat phase information represented by an in-phase image component and an out-of-phase image component, the same or a separate computer configured to:

cause identification of image points in the reconstructed image which image points according to a test criterion represent pure fat tissue thus producing a pure-fat image, cause a segmented image to be produced based on the pure-fat image, the segmented image being free from non-tissue image data, and the same or a separate computer configured to generate an intensity correction field by interpolating a fat image (F) using the segmented image, said fat image being based on the in-phase image component (IP) and the out-of-phase image component (OP).

31. A magnetic resonance imaging system as claimed in claim 30, further comprising:

the same or a separate computer configured to apply the intensity correction field to the in-phase and out-of-phase image components of the reconstructed image, the at least one resulting image representing at least one of:

a water image, a fat image, and a joint image representing both water and fat, an image component of the second image.

32. A magnetic resonance imaging system as claimed in claim 30, further comprising:

computer controlled data acquisition hardware configured to acquire a second image data set;

the same or a separate computer configured to reconstruct a second image based on said second image data set; and the same or a separate computer configured to apply the intensity correction field to an image component of the second image.

* * * * *